United States Patent
Cai et al.

(10) Patent No.: US 10,153,782 B2
(45) Date of Patent: Dec. 11, 2018

(54) ERROR CORRECTION CODE (ECC) SELECTION USING PROBABILITY DENSITY FUNCTIONS OF ERROR CORRECTION CAPABILITY IN STORAGE CONTROLLERS WITH MULTIPLE ERROR CORRECTION CODES

(71) Applicant: Seagate Technology LLC, Cupertino, CA (US)

(72) Inventors: Yu Cai, San Jose, CA (US); Yunxiang Wu, Cupertino, CA (US); Erich F. Haratsch, San Jose, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/198,533

(22) Filed: Jun. 30, 2016

(65) Prior Publication Data

US 2016/0315635 A1   Oct. 27, 2016

Related U.S. Application Data

(62) Division of application No. 14/264,419, filed on Apr. 29, 2014, now Pat. No. 9,419,655.
(Continued)

(51) Int. Cl.
*H03M 13/11* (2006.01)
*H03M 13/35* (2006.01)
(Continued)

(52) U.S. Cl.
CPC ..... *H03M 13/1157* (2013.01); *G06F 11/1004* (2013.01); *G06F 11/1048* (2013.01);
(Continued)

(58) Field of Classification Search
CPC ......... H03M 13/1102; H03M 13/1108; H03M 13/1111; H03M 13/1157; H03M 13/1174;
(Continued)

(56) References Cited

U.S. PATENT DOCUMENTS

| 6,272,659 B1 | 8/2001 | Zook | 714/774 |
| 8,560,918 B1 | 10/2013 | Yang | 714/758 |

(Continued)

OTHER PUBLICATIONS

Rem-Shou Lui et al., "Optimizing NAND Flash-Based SSDs via Retention Relaxation", In Proceedings of the 10th USENIX conference on File and Storage Technology (FAST' 12), 2012.

*Primary Examiner* — Christian M Dorman
(74) *Attorney, Agent, or Firm* — Christopher P. Maiorana, PC (57) ABSTRACT

A method of characterizing a distribution of a maximum number of errors that first cause uncorrectable error correction code failure for hard low density parity check codes includes selecting a low density parity check code, generating encoded data with the low density parity check code and writing the encoded data to a number of memory blocks, reading the encoded data from the number of memory blocks and determining any pages having a first uncorrectable error correction code failure, determining a number of raw bit errors for each page having a first uncorrectable error correction code failure, incrementing an error count value corresponding to each of the numbers of raw bit errors determined, and repeating the generating, reading, determining, and incrementing steps for a predetermined range of values of a predetermined reliability statistic of the memory blocks.

20 Claims, 8 Drawing Sheets

Related U.S. Application Data (60) Provisional application No. 61/975,202, filed on Apr. 4, 2014.

(51) Int. Cl.
   *G06F 11/10*   (2006.01)
   *H03M 13/37*   (2006.01)
   *H03M 13/00*   (2006.01)

(52) U.S. Cl.
   CPC .... *H03M 13/1102* (2013.01); *H03M 13/1111* (2013.01); *H03M 13/1174* (2013.01); *H03M 13/35* (2013.01); *H03M 13/353* (2013.01); *H03M 13/356* (2013.01); *H03M 13/3715* (2013.01); *H03M 13/611* (2013.01); *H03M 13/6513* (2013.01); *H03M 13/6516* (2013.01); *G06F 11/108* (2013.01); *H03M 13/1108* (2013.01)

(58) Field of Classification Search
   CPC .. H03M 13/35; H03M 13/353; H03M 13/356; H03M 13/3715; H03M 13/611; H03M 13/6513; H03M 13/6516; G06F 11/1004; G06F 11/1048; G06F 11/108
   See application file for complete search history.

(56) References Cited

U.S. PATENT DOCUMENTS

| | | | |
|---|---|---|---|
| 8,898,549 B2 | 11/2014 | Hubris | 365/185.09 |
| 9,021,337 B1 | 4/2015 | Northcott | 714/773 |
| 2003/0005385 A1 | 1/2003 | Singer | 714/758 |
| 2014/0157078 A1 | 6/2014 | Danilak | 714/758 |
| 2015/0082126 A1 | 3/2015 | Vernon | 714/774 |

ERROR CORRECTION CODE (ECC) SELECTION USING PROBABILITY DENSITY FUNCTIONS OF ERROR CORRECTION CAPABILITY IN STORAGE CONTROLLERS WITH MULTIPLE ERROR CORRECTION CODES

This application relates to U.S. Ser. No. 14/264,419, filed Apr. 29, 2014, which relates to U.S. Provisional Application No. 61/975,202, filed Apr. 4, 2014, each of which are hereby incorporated by reference in their entirety.

FIELD OF THE INVENTION

The invention relates to storage controllers generally and, more particularly, to a method and/or apparatus for implementing error correction code (ECC) selection in NAND flash controllers with multiple ECCs.

BACKGROUND

Multiple error correction codes (ECCs) are implemented in contemporary flash controllers to adapt to the fact that bit error rate (BER) increases and signal-to-noise ratio (SNR) decreases over program and erase (P/E) cycles. An accurate policy to decide when to switch from a weaker ECC to a stronger ECC over P/E cycles is needed. Unlike traditional Bose-Chaudhuri-Hocquenghem (BCH) codes, there is no hard limit for the maximum number of errors that can be corrected by hard-decision low density parity check (LDPC) codes. Deciding when to switch from a weaker LDPC code to a stronger LDPC code based on the number of errors being corrected is difficult. Switching to a stronger LDPC code based on real-time testing of the number of uncorrectable error correction codes (UECCs) can result in the switch occurring too late or too early. For hard LDPC only products (with less implementation cost), testing of UECC failure rate in real-time is not acceptable.

It would be desirable to have a method and/or apparatus for implementing error correction code (ECC) selection in NAND flash controllers with multiple ECCs.

SUMMARY

The invention concerns an apparatus including an error correction code circuit and an error correction code selection circuit. The error correction code circuit may be configured to encode and decode data using any of a plurality of error correction codes. The error correction code selection circuit may be configured to control which of the plurality of error correction codes is used by the error correction code circuit to encode and decode data responsive to one or more reliability statistics and predetermined data characterizing distribution properties of each of the plurality of error correction codes.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a method and/or apparatus for implementing error correction code (ECC) selection in NAND flash controllers with multiple ECCs that may (i) predict a first time uncorrectable error correction code (UECC) failure rate based on a number of errors already corrected, (ii) avoid a first UECC of weaker low density parity check (LDPC) codes before switching to stronger LDPC codes, (iii) allow the UECC failure rate to be accurately controlled within the a UECC failure specification without a UECC actually happening, (iv) provide a policy to decide when to switch from weaker LDPC codes to stronger LDPC codes, and/or (v) be implemented as one or more integrated circuits.

Unlike traditional Bose-Chaudhuri-Hocquenghem (BCH) codes, hard low density parity check (LDPC) codes do not have a hard limit of the maximum number of errors that are correctable. There is a range of errors that first cause uncorrectable error correction code (UECC) failure and a distribution of the number of errors that cause a first UECC exists for each LDPC code. In various embodiments, the distributions for the LDPC codes and other distribution properties are characterized (offline) before being delivered in products. In various embodiments, the offline characterization results are implemented as a lookup table (LUT) in a flash controller. Since multiple LDPC codes are now widely implemented in flash controllers to adapt to a program and erase (P/E) cycle dependent channel, a flash controller implemented in accordance with an embodiment of the present invention provides a policy to decide when a switch from weaker LDPC codes to stronger LDPC codes is appropriate.

A distribution of the maximum number of errors that cause a first time UECC exists for each hard LDPC code. Based on such distributions, embodiments of the invention may decide to either avoid hard-LDPC UECC failure or accurately control first time UECC rate even when UECC failure does not happen. The distribution of the maximum number of errors that first cause UECC failure for hard LDPC codes is characterized offline. A method for characterizing the distribution over P/E cycles is presented herein. The distribution statistics can also be learned offline and implemented as a lookup table in a product to record key statistics with very low cost (e.g. only a few bytes to store statistics for each type of LDPC codes).

In various embodiments, first time UECC failure of hard LDPC codes is avoided. A switch is made to a stronger ECC before a UECC actually happens for a current weaker LDPC code. In other embodiments, a method is provided for accurately controlling the UECC failure rate to be below a predefined number without switching too early or too late to a stronger ECC.

Figure 1:
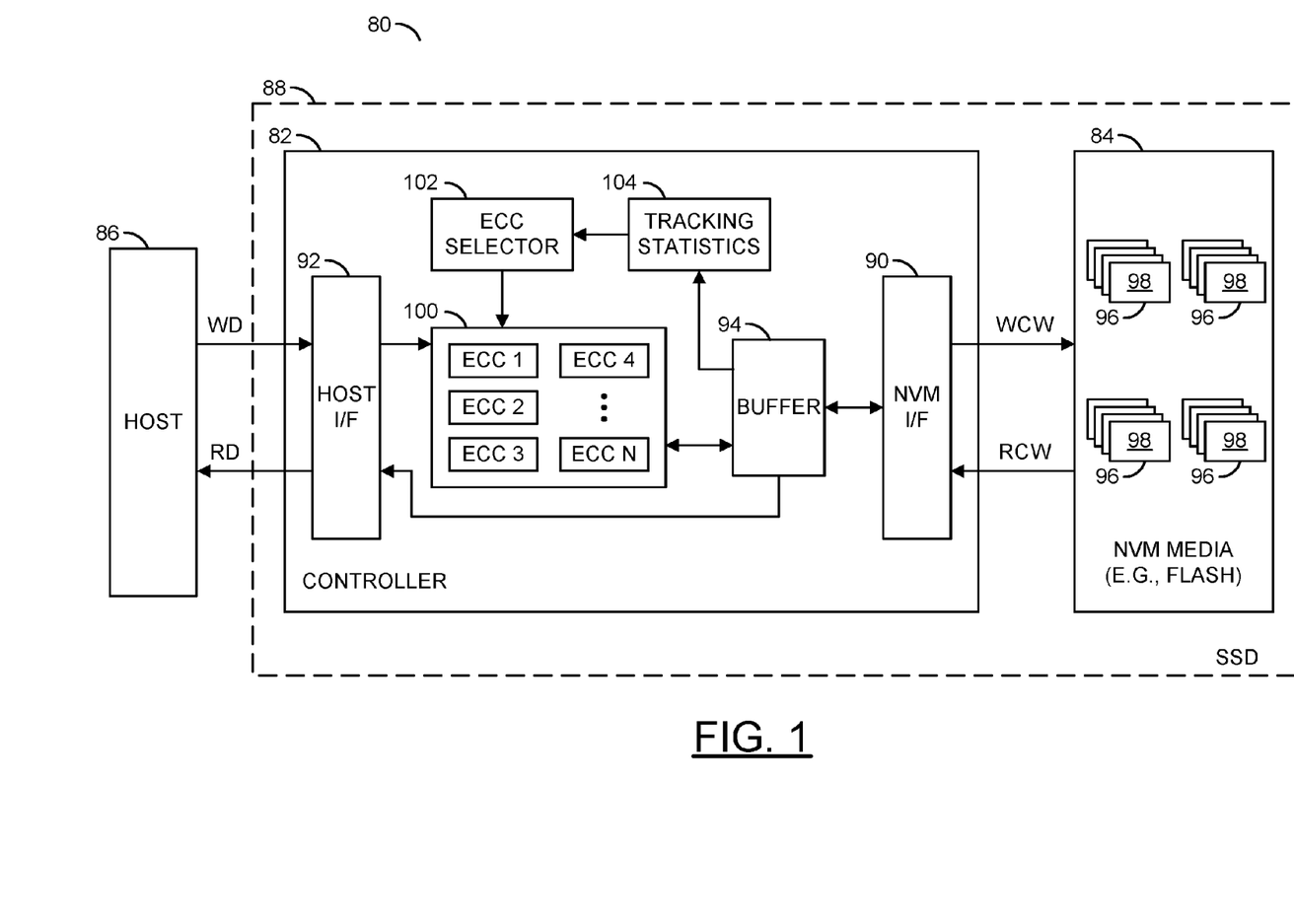
FIG. 1 is a diagram illustrating an example implementation of an apparatus in accordance with an embodiment of the invention.
Figure 2A:
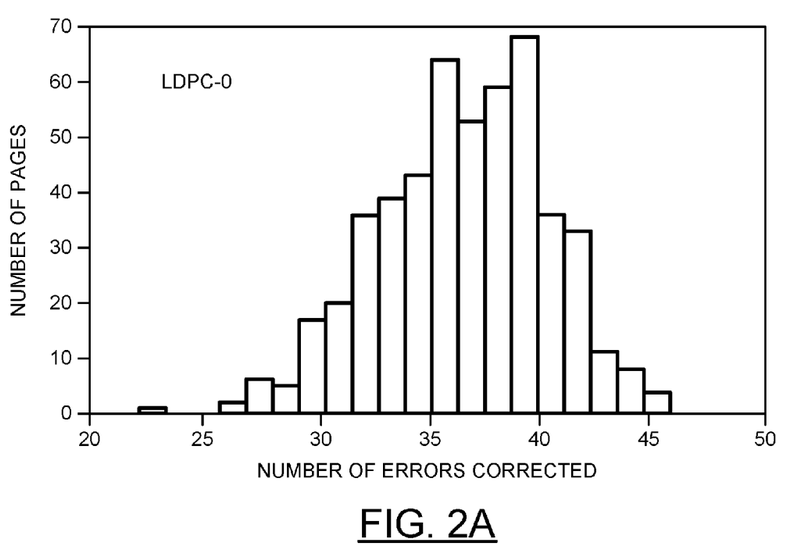
FIGS. 2A-2F are diagrams illustrating example error distributions for a number of low density parity check codes.
Figure 2B:
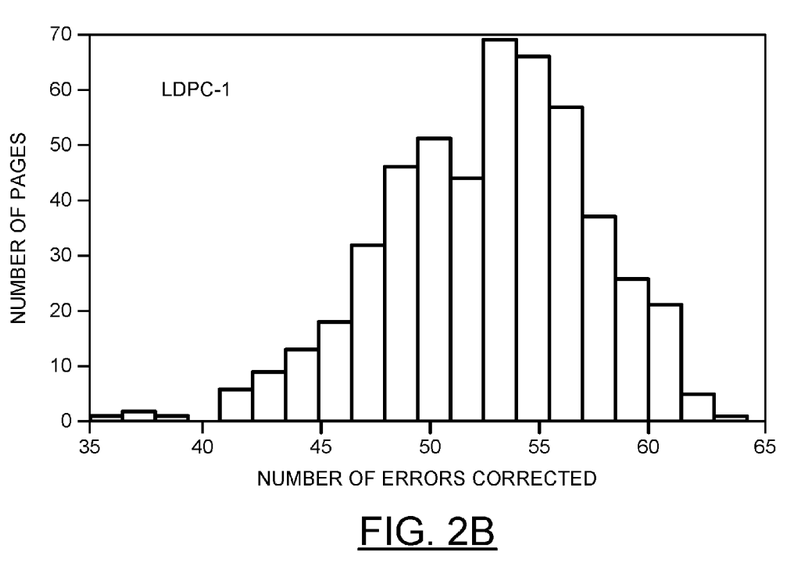
Figure 2C:
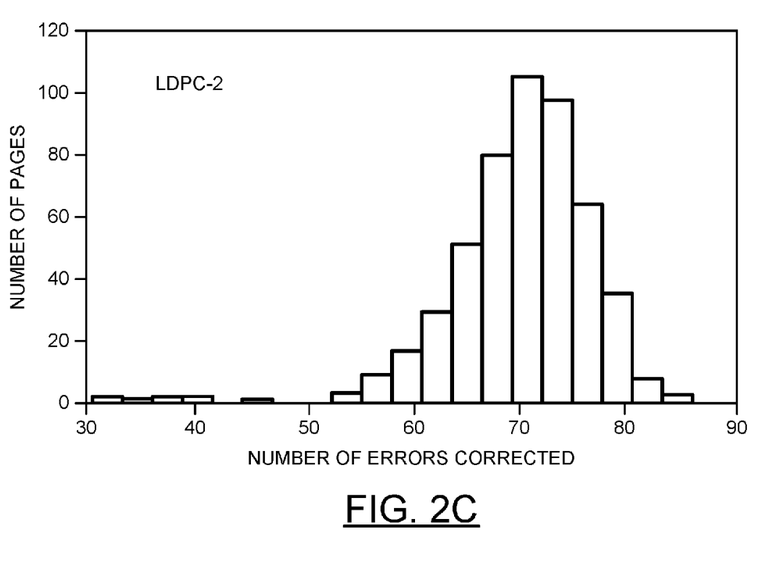
Figure 2D:
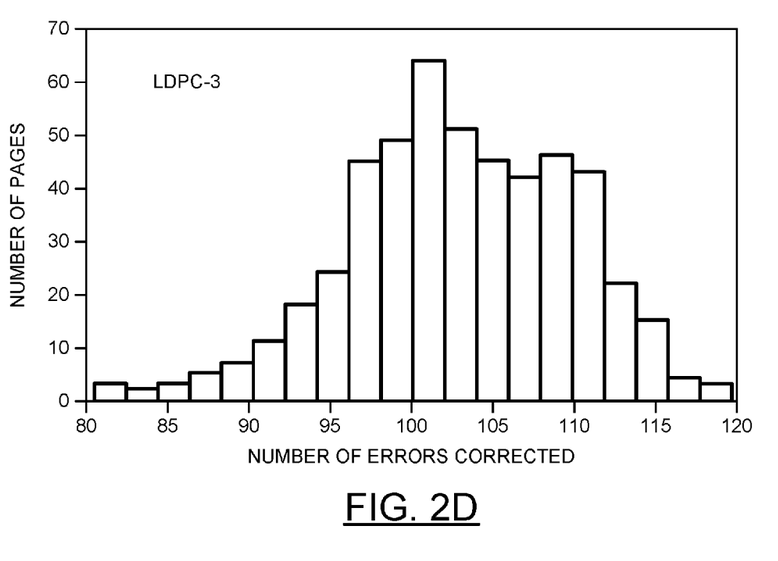
Figure 2E:
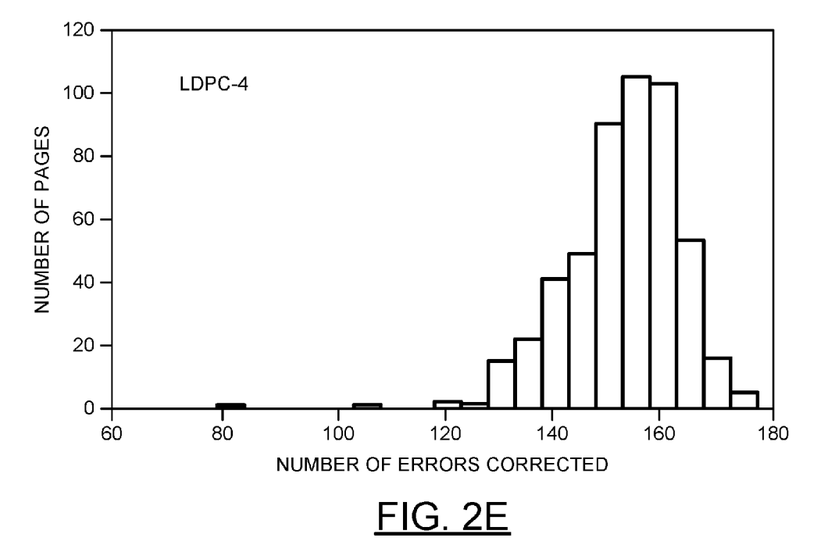
Figure 2F:
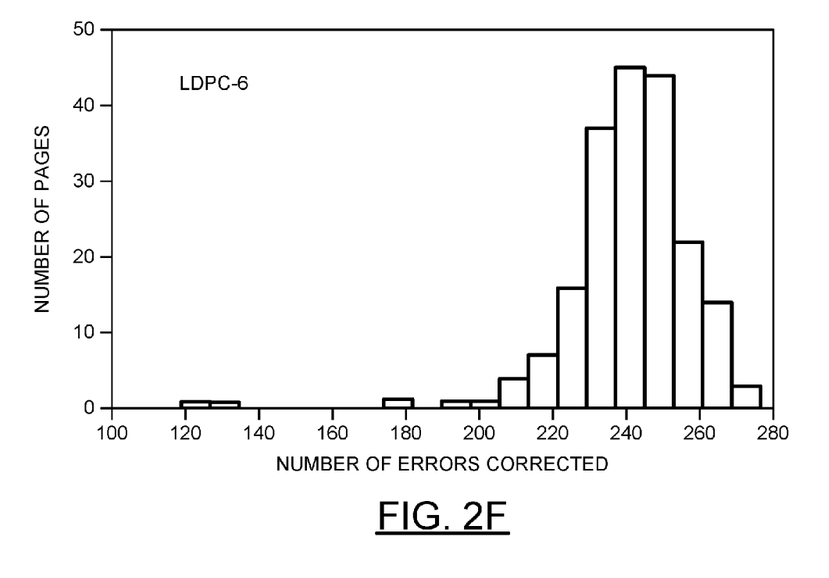

Referring to FIG. 1, a block diagram of an example implementation of an apparatus 80 is shown. The apparatus (or circuit or device or integrated circuit) 80 implements a computer system having a non-volatile memory circuit. The apparatus 80 generally comprises a block (or circuit) 82, a block (or circuit) 84, and a block (or circuit) 86. The circuits 82, 84, and 86 may be represented as modules and/or blocks that may be implemented in hardware (circuitry), as software, as a combination of hardware and software, or other implementations. A combination of the circuits 84 and 86 may form a solid state drive or disk (SSD) 88.

A signal (e.g., WD) is generated by the circuit 86 and presented to the circuit 82. The signal WD generally conveys write data to be written into the circuit 84. A signal (e.g., WCW) is generated by the circuit 82 and transferred to the circuit 84. The signal WCW carries error correction coded (e.g., ECC) write codewords written into the circuit 84. A signal (e.g., RCW) is generated by the circuit 84 and received by the circuit 82. The signal RCW carries error correction coded codewords read from the circuit 84. A signal (e.g., RD) is generated by the circuit 82 and presented to the circuit 86. The signal RD carries error corrected versions of the data in the signal RCW. The contents of the signals WD and RD are generally associated with write and read commands (or requests), respectively, from the circuit 86. The circuit 86 is shown implemented as a host circuit. The circuit 86 is generally operational to read and write data to and from the SSD 88. When writing, the circuit 86 presents the write data in the signal WD. The read data requested by the circuit 86 is received via the signal RD.

The circuit 82 is shown implemented as a controller circuit. The circuit 82 is generally operational to control reading from and writing to the circuit 84. The circuit 82 may be implemented as one or more integrated circuits (or chips or die). The circuit 82 may be used for controlling one or more solid state drives, embedded storage, non-volatile memory devices, or other suitable control applications. In various embodiments, the circuit generally comprises a block (or circuit) 90, a block (or circuit) 92, a block (or circuit) 94, a block (or circuit) 100, a block (or circuit) 102, and a block (or circuit) 104. The circuit 90 implements a non-volatile memory (e.g., flash) interface. The circuit 92 implements a host interface. The circuit 94 implements a memory buffer. The circuit 100 may implement an error correction code coding circuit (or processor). In various embodiments, the circuit 100 is configured to encode and decode data using any of a plurality of error correction codes (e.g., ECC 0, . . . , ECC n). In some embodiments, the error correction codes comprise low density parity check (LDPC) codes. In some embodiments, the circuit 100 may comprise a soft decision processor and a soft decision enabled decoder. The circuit 102 may implement an error correction code selection circuit. The circuit 104 may implement a channel statistic tracking scheme and distribution properties lookup table in accordance with an embodiment of the invention. The circuit 102 may be configured to control which of the plurality of error correction codes is used by the circuit 100 to encode and decode data responsive one or more signals from the circuit 104 related to one or more reliability statistics and predetermined data characterizing distribution properties of each of the plurality of error correction codes. The circuits 90 to 104 may be represented as modules and/or blocks that may be implemented in hardware (circuitry), as software, as a combination of hardware and software, or as other implementations.

The circuit 82 is generally coupled to the circuit 84 via one or more device interfaces implemented by the circuit 90. According to various embodiments, the device interfaces (or protocols) may include, but are not limited to, one or more of: an asynchronous interface; a synchronous interface; a double data rate (DDR) synchronous interface; an ONFI (open NAND flash interface) compatible interface, such as an ONFI 2.2 compatible interface; a Toggle-mode compatible non-volatile memory interface; a non-standard version of any of the preceding interfaces; a custom interface; or any other type of interface used to connect to storage devices. According to various embodiments, the device interfaces are organized as: one or more busses with one or more non-volatile memory devices 96 per bus; one or more groups of busses with one or more non-volatile memory devices 96 per bus, where busses in a group are generally accessed in parallel; or any other organization of non-volatile memory devices 96 coupled to then device interfaces of the circuit 90.

In general, the number of device interfaces implemented by the circuit 90 may be varied between embodiments. In various embodiments, the device interfaces are implemented as flash channels (or flash lanes), each of which has one or more flash devices 96, each of which has one or more flash dies 98. For example, in some embodiments, each flash device 96 is configured as a single package with 2 channels and with 2N flash dies 98, having N dies on one channel, and N die on another channel. A package may be configured to support more than one channel to have more bandwidth. In various embodiments, board-level constraints may dictate a particular configuration, though factors like delivered bandwidth and capacity may come into play, too. For example, a non-volatile memory device 96 having four channels in one package (e.g., that might have 4 or 8 dies—either 1 or 2 per channel) may be implemented in order to increase bandwidth (e.g., more channels) without increasing board real estate (e.g., occupying less area than 2 packages, each of which has only 2 channels). The device interfaces implemented in the circuit 90 may also be configured to couple read only memory (ROM) devices (not shown) providing portions of a non-user data area storing system data.

The circuit 82 may be coupled to the circuit 86 via one or more external interfaces implemented by the circuit 92. According to various embodiments, the external interfaces (or protocols) implemented by the circuit 92 may include, but are not limited to, one or more of: a serial advanced technology attachment (SATA) interface; a serial attached small computer system interface (serial SCSI or SAS interface); a (peripheral component interconnect express (PCIe) interface; a Fibre Channel interface; an Ethernet Interface (such as 10 Gigabit Ethernet); a non-standard version of any of the preceding interfaces; a custom interface; or any other type of interface used to interconnect storage and/or communications and/or computing devices. For example, in some embodiments, the circuit 82 includes a SATA interface and a PCIe interface.

The circuit 92 sends and receives commands and/or data via the external interface(s), and, in some embodiments, tracks progress of individual commands. For example, the individual commands may include a read command and a write command. The read command may specify an address (such as a logical block address, or LBA) and an amount of data (such as a number of LBA quanta, e.g., sectors) to read; in response the circuit 82 provides read status and/or read data. The write command may specify an address (such as an LBA) and an amount of data (such as a number of LBA quanta, e.g., sectors) to write; in response, the circuit 82 provides write status and/or requests write data and optionally subsequently provides write status. In some embodiments, the circuit 92 is compatible with a SATA protocol and, using NCQ commands, is enabled to have up to 32 pending commands, each with a unique tag represented as a number from 0 to 31. In some embodiments, the circuit 82 is enabled to associate an external tag for a command received via the circuit 92 with an internal tag used to track the command during processing by the circuit 82.

According to various embodiments, the circuit 82 includes at least one buffer 94, one or more processing units, and one or more error-correction code (ECC) encoders/decoders (e.g., the circuit 100). The one or more processing units may optionally and/or selectively process some or all data sent between the at least one buffer and the circuit 90 and optionally and/or selectively process data stored in the at least one buffer 94. According to various embodiments, the one or more ECC decoders optionally and/or selectively process some or all data sent between the at least one buffer 94 and the device interfaces of the circuit 90, and the one or more ECC decoders optionally and/or selectively process data stored in the at least one buffer 94. In some embodiments, the one or more ECC decoders implement one or more of: a cyclic redundancy check (CRC) code; a Hamming code; an Reed-Solomon (RS) code; a Bose Chaudhuri Hocquenghem (BCH) code; an low-density parity check (LDPC) code; a Viterbi code; a trellis code; a hard-decision code; a soft-decision code; an erasure-based code; any error detecting and/or correcting code; and any combination of the preceding. In some embodiments, the circuit 82 uses one or more engines to perform one or more of: encrypting; decrypting; compressing; decompressing; formatting; reformatting; transcoding; and/or any other data processing and/or manipulation task.

In various embodiments, the circuit 90 may be configured to control one or more individual non-volatile memory lanes (channels). Each of the memory lanes is enabled to connect to one or more non-volatile memory devices 96. In some embodiments, the circuit 90 may implement multiple memory lane controller instances to control a plurality of non-volatile memory lanes. The non-volatile memory interface 90 is configured to couple the circuit 82 to the non-volatile memory media 84. The non-volatile memory media 84 may comprise one or more non-volatile memory devices 96. The non-volatile memory devices 96 have, in some embodiments, one or more non-volatile memory units (e.g., die, disk platter, etc.) 98. According to a type of a particular one of the non-volatile memory devices 96, a plurality of non-volatile memory units 98 in the particular non-volatile memory device 96 are optionally and/or selectively accessible in parallel. The non-volatile memory devices 96 are generally representative of one or more types of storage devices enabled to communicatively couple to the circuit 82. However, in various embodiments, any type of storage device is usable, such as SLC (single level cell) NAND flash memory, MLC (multi-level cell) NAND flash memory, TLC (triple level cell) NAND flash memory, NOR flash memory, electrically programmable read-only memory (EPROM or EEPROM), static random access memory (SRAM), dynamic random access memory (DRAM), magneto-resistive random-access memory (MRAM), ferromagnetic memory (e.g., FeRAM, F-RAM FRAM, etc.), phase-change memory (e.g., PRAM, PCRAM, etc.), racetrack memory (or domain-wall memory (DWM)), resistive random-access memory (RRAM or ReRAM), or any other type of memory device or storage medium (e.g., other non-volatile memory devices, hard disk drives (HDDs), communications channels, etc.).

In some embodiments, the circuit 82 and the non-volatile memory media 84 are implemented on separate integrated circuits. When the circuit 82 and the non-volatile memory media 84 are implemented as separate integrated circuits (or devices), the non-volatile memory interface 90 is generally enabled to manage a plurality of data input/output (I/O) pins and a plurality of control I/O pins. The data I/O pins and the control I/O pins may be configured to connect the device containing the controller 82 to the external device(s) forming the non-volatile memory media 84. In various embodiments, the circuit 82 is implemented as an embedded controller.

The host interface 92 is configured to receive commands and send responses to the host 86. In embodiments implementing a plurality of non-volatile memory lanes, the circuit 82 and the NVM interface 90 of the circuit 82 may implement multiplexing circuitry coupling multiple instances of memory lane controllers to a processing unit providing scheduling and/or data management of the plurality of non-volatile memory devices 96. In some embodiments, the processing unit comprises data buffering and direct memory access (DMA) engines to store data or other information and to move the data or other information between the host 86 and the NVM media 84 using one or more memory lane controllers within the circuit 82.

When a non-volatile memory read operation is performed (e.g., in response to a request originating either externally from the host 86 or internally from the circuit 82) raw data is retrieved from the NVM media 84 and placed in a buffer (e.g., the buffer 94). In various embodiments, to ensure the data returned is correct, soft decision processing and soft decoder operations are performed in the circuit 82 to correct the raw data read from the NVM media 84. In some embodiments, one of a plurality of LDPC (low-density parity-check) codes is selected for use. The soft decoder operations performed in the circuit 100 generally operate on a granularity of a codeword (of fixed or variable size), referred to as an e-page. In some embodiments, a codeword length of 2K Bytes is used.

In various embodiments, the non-volatile memory (NVM) die 98 comprise a number of planes (e.g., one, two, four etc.). Each plane comprises a number (e.g., 512, 1024, 2048, etc.) of NVM blocks. Each of the NVM blocks comprises a number of pages, such as 128, 256, or 512 pages. A page is generally the minimum-sized unit that can be independently written, and a block is generally the minimum-sized unit that can be independently erased. In various embodiments, each page of the non-volatile memory devices 96 comprises a plurality of e-pages, which may also be referred to as ECC-pages or "read units." Each e-page is an amount of user data and the corresponding ECC data that, together, comprise one ECC codeword (e.g., a correctable unit). Typically, there are an integer number of e-pages per NVM page, or in some embodiments, per multi-plane page. The e-pages are the basic unit that can be read and corrected, hence e-pages are also called read units. Typically, read units may have 1 KB or 2 KB of user data, and an even share of the remaining bytes in the non-volatile memory page (so that all read units in a same one of the multi-plane pages are the same total size). An e-page (or read unit) is thus the minimum-sized unit that can be independently read (and ECC corrected).

The circuit 94 is shown implemented as a buffer (memory) circuit. The circuit 94 is operational to buffer (store) codewords (raw data) received from the circuit 84 via the circuit 90. The read codewords are presented from the circuit 94 to the circuit 100. The circuit 100 is shown implemented as an error correction coding circuit. In some embodiments, the circuit 100 is implemented as one or more low-density parity-check decoder circuits. The circuit 100 is operational to perform both hard-decision (e.g., HD) decoding and soft-decision (e.g., SD) decoding of the codewords received from the circuit 94. The soft-decision decoding generally utilizes the decoding parameters. The circuit 100 is operational to generate soft decision information (or decoding parameters), such as in the form of log likelihood ratio (LLR) values. In some embodiments, the circuit 94 is also operational to buffer the soft decision information (e.g., decoding parameters) generated by the circuit 100. The soft decision information is used in a soft-decision decoding process performed by the circuit 100. The circuit 100 may comprise a dedicated hardware unit that processes raw soft bits read from the circuit 84. The circuit 100 generally uses information regarding an erase state distribution of the circuit 84 in the process of generating the decoding parameters. The circuit 100 may be implemented as a processor core (e.g., an ARM core, etc.) or a custom designed circuit.

The circuit 102 is shown implemented as a error correction code selection circuit. The circuit 102 is operational to select between a number of error correction codes (e.g., from weakest to strongest) based on distribution properties of the error correction codes and tracking information (e.g., statistics) received from the circuit 104. The circuit 104 is shown implemented as an adaptive channel tracking circuit. The circuit 104 is operational to track channel parameters and/or statistics. The channel parameters and/or statistics may include, but are not limited to one or more of a count of the number of program and erase (P/E) cycles (PEC), charge loss over time (retention times), program interference from the programming of neighboring cells (write disturb counts), program interference from the reading of neighboring cells (read disturb counts), and non-erase state and/or erase state read voltage distributions. The circuit 104 is operational to generate one or more metrics/statistics based upon the raw read data. The circuit 104 is also operational provide inputs to the circuit 102 based on one or more of the tracked channel parameters and/or metrics/statistics. In various embodiments, the predetermined distribution properties for the error correction codes are stored in a lookup table. The lookup table may be implemented as part of the circuit 102 or the circuit 104.

In various embodiments, the circuits 100, 102, and 104 may be configured to implement one or both of a first process (or method) to avoid the first time UECC failure of hard LDPC codes and a second process (or method) to accurately control the UECC failure rate to below a predefined number while not switching to a stronger ECC too early or too late. The first method can be applied to flash controllers that are sensitive to performance degradation. The first method is suitable for hard-LDPC only flash controller products also. Some vendors may use hard-LDPC only flash controllers to avoid the high cost of soft-LDPC codes, which are seldom used but contribute most of the cost. Using the first method, the flash controller can smoothly and gradually switch from weaker ECC to stronger ECC without obvious ECC failure and performance degradation at some point. The first method is especially useful for real time systems that have strict latency specifications. The second method can accurately control the first time UECC failure rate to be essentially equal to an allowed level without switching from weaker ECC to stronger ECC either too early or too late. Even when the UECC is not observable, the second method can still safely switch LDPC from weaker codes to stronger codes. Without implementing a method in accordance with an embodiment of the invention, there is a probability that hard-LDPC can succeed at a current time, but at a next time both hard-LDPC and soft-LDPC may fail to recover the data and cause an unrecoverable error, especially in the case where operation is near the upper bound of the distribution for the particular LDPC code.

A NAND flash controller can have multiple ECCs (e.g. LDPC codes). Stronger ECCs may involve high storage overhead, low coding rate, and high power consumption. Weaker ECCs have low storage overhead, high coding rate, and low power consumption. Signal-to-noise ratio (SNR) decreases and raw bit error rate (RBER) increases as NAND flash memory ages (e.g. number of P/E cycles increases). As the flash memory ages, a flash controller needs to switch from weaker ECC to stronger ECC for fault tolerance. LDPC codes are widely implemented in flash controllers. When reading flash memory, a first step comprises decoding the read data using hard LDPC. In controllers with both hard LDPC and soft LDPC decoding, if the hard LDPC decoding fails, soft LDPC decoding is triggered to overcome the errors that can not be handled by the hard LDPC.

Hard LDPC does not need to read a flash page multiple times to generate soft information. Thus, hard LDPC is much faster than soft LDPC. It is desirable to have hard LDPC succeed most of the time and soft LDPC triggered only occasionally. For example, a hard LDPC failure rate should be small enough to satisfy read performance specifications (e.g. $<10^{-4}$). If the hard LDPC failure rate is too high, the flash controller needs to switch from weaker LDPC codes to stronger LDPC codes so that the hard LDPC decoding can still succeed most of the time without much performance degradation due to slow soft LDPC decoding and reading.

Referring to FIGS. 2A-2F, diagrams are shown illustrating characterization histograms of the frequency of the number of errors that cause a first uncorrectable error correction code (UECC) failure for a variety of low density parity check (LDPC) codes. Unlike BCH codes, the error correction capability (e.g. maximum number of raw errors that can be corrected) of LDPC codes is not fixed, but instead follows a particular characterizable distribution. In other words, if hard LDPC decoding first fails at a particular smaller raw bit error rate (RBER), it is likely that the hard LDPC decoding can decode successfully later, even at a higher RBER. Switching from a weaker LDPC code to stronger LDPC codes too early, can result in unnecessary system performance and cost degradation in terms of storage overhead, power consumption, and latency. FIGS. 2A through 2F show histograms corresponding to LDPC codes LDPC-0, LDPC-1, LDPC-2, LDPC-3, LDPC-4, and LDPC-6, respectively.

Figure 3:
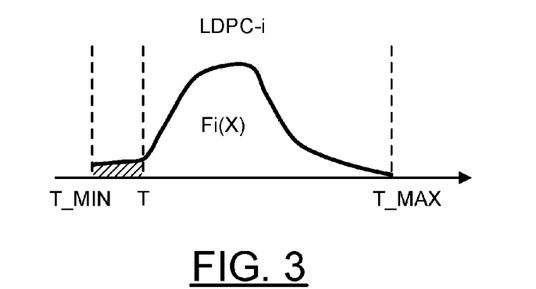
FIG. 3 is a diagram illustrating a probability distribution function representing an error correction capability of a single error correction code.

Referring to FIG. 3, a probability distribution function curve is shown illustrating an example error correction capability of a hard LDPC (e.g., LDPC-i). When the number of errors is less than a minimum threshold (e.g., T_min), LDPC-i can be decoded without an uncorrectable error correction code (UECC) occurring. When the number of errors is larger than a maximum threshold (e.g., T_max), LDPC-i will have a UECC occur with 100% probability. When the number of errors is at an intermediate value (e.g., T), the probability of a first UECC of LDPC-i may be expressed by the following Equation 1:

$$\int_{T_{MIN}}^{T} Fi(x)dx. \qquad \text{EQ. 1}$$

The probability is graphically represented by the area under the curve between T_min and T (shadowed). When T equals T_min, the probability is zero. When T equals T_max, or infinity the probability is 100%. The function Fi(x) and the parameters T_min and T_max can be used to characterize the distribution properties of the LDPC-i code.

Figure 4:
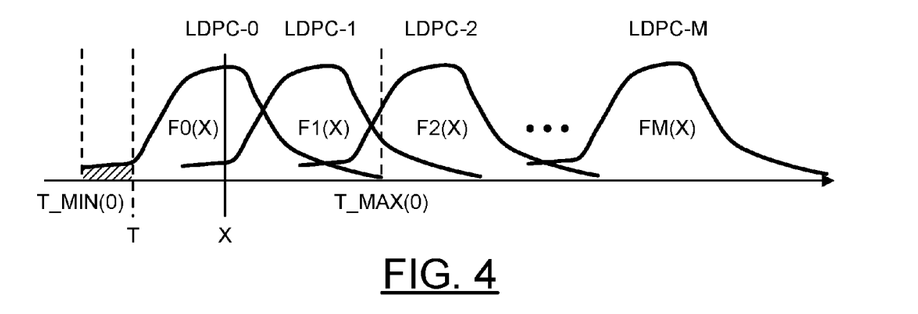
FIG. 4 is a diagram illustrating a probability distribution function (PDF) representing an error correction capability of multiple error correction codes (ECCs)

Referring to FIG. 4, a diagram is shown illustrating a probability density function (PDF) of error correction capability with multiple LDPCs. The design of LDPCs in a flash controller involves passing a strict qualification test. During characterization, a whole SSD is selected and certain LDPC codes are used. The SSD is worn from a P/E cycle count of zero to a maximum count of P/E cycles that causes a first UECC for each of the flash pages of the SSD. The number of errors that first cause UECC for the LDPC codes is recorded for different locations. For 2K Byte LDPC codes, the number can be up to 128 million for a 256 GB SSD. Using the numbers (e.g. the 128 million numbers) obtained during wear testing, the distribution of the number of errors that first cause UECC is obtained. The distribution Fi(x) for the particular LDPC-i that is selected in the flash controller is determined, along with the other parameters, such as T_min and T_max (the lower bound and upper bound of the distribution). In various embodiments, a flash controller with M LDPC codes (e.g., LDPC-0, LDPC-1, . . . , LDPC-M), includes a lookup table with M entries to record the statistical properties of the distributions of the ECC codes.

The probability density function (PDF) of the error correction capability with multiple LDPCs is a combination of the error correcting capabilities of each individual LDPC. When the number of errors equals a value (e.g. X), the LDPC-0 code may still be able to correct the errors with a first probability (e.g., P0) and the LDPC-1 code may still be able to correct the errors with a second probability (e.g., P1). The probability of a first time UECC of the LDPC-1 code is less than the probability of a first time UECC of the LDPC-0 code. In various embodiments, a threshold can be defined such that when the probability of the first time UECC of the LDPC-0 code is larger than the predefined threshold, a switch from the LDPC-0 code to the LDPC-1 code or an even higher LDPC code is made.

Figure 5:
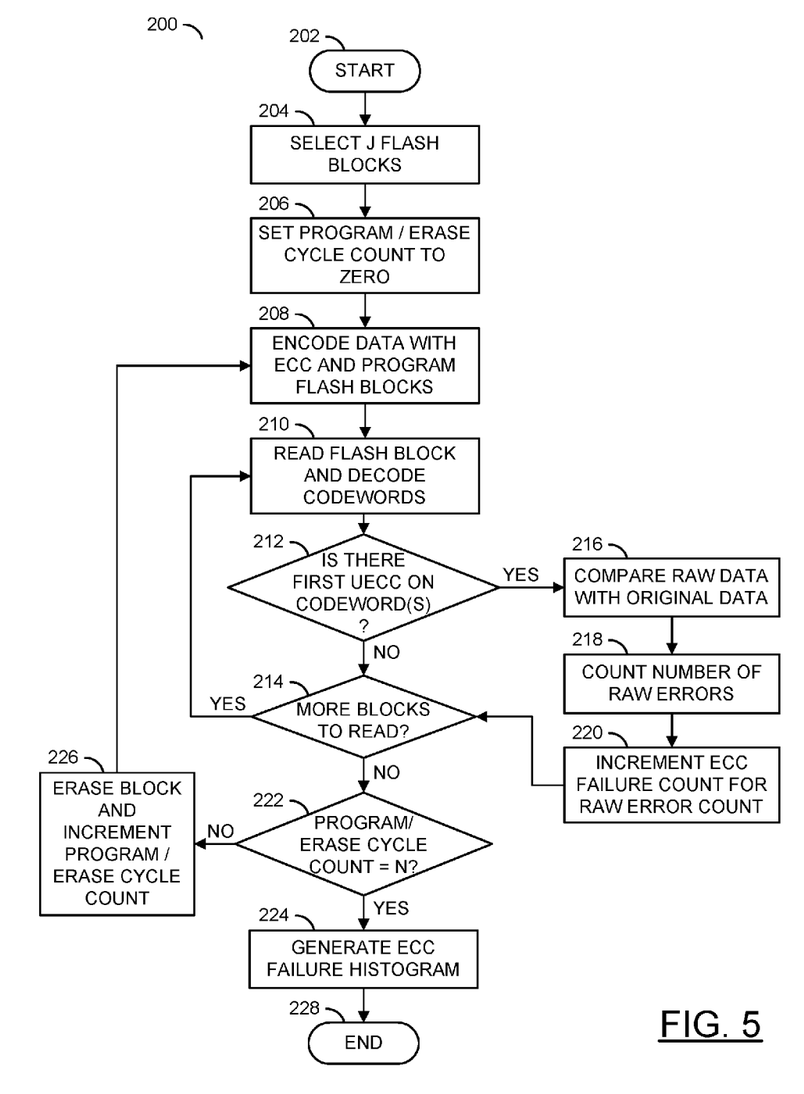
FIG. 5 is a flow diagram illustrating an offline characterization process in accordance with an embodiment of the invention.

Referring to FIG. 5, a flow diagram of a process 200 illustrating an example LDPC characterization process in accordance with an embodiment of the invention is shown. In various embodiments, the process (or method) 200 comprises a number of steps (or states) 202-228. The process 200 may be implemented during a qualification phase of an SSD controller. The process 200 begins with the step 202 and moves to a step 204. In the step 204, a number (e.g., J) of flash blocks are selected for performing offline LDPC characterization. In a step 206, a program and erase cycle count is set to zero. In a step 208, original data is encoded with the LDPC code being characterized and the encoded data (codewords) are written to the selected flash blocks. In a step 210, the process 200 reads the codewords from flash blocks to a buffer and decodes the codewords using hard LDPC decoding.

In a step 212, the process 200 determines whether the LDPC decoding reported any UECCs. If no UECC was reported, the process 200 moves to a step 214. If a UECC was reported, the process 200 moves to a step 216. In the step 216, the process 200 compares raw read data in the buffer with the original data. In a step 218, the process determines a number of raw bit errors that caused the UECC error based on the comparison of the raw and original data. In a step 220, the process 200 increments an ECC failure count corresponding to the number of raw bit errors counted in the step 218 and moves to the step 214.

In the step 214, the process 200 checks whether there are more blocks to be read. If there are blocks still to be read, the process 200 returns to the step 210 to read the next block. If no more blocks remain to be read, the process 200 moves to a step 222. In the step 222, the process checks the P/E cycle count to determine whether the number of P/E cycles is less than N, where N is selected high enough that at the end of N P/E cycles all the codewords in the selected blocks will have uncorrectable ECC errors. If the P/E cycle count equals N, the process 200 moves to a step 224. If the P/E cycle count is less than N, the process 200 moves to a step 226. In the step 224, the process 200 generates an ECC failure histogram for the selected LDPC code, then moves to the step 228 and terminates. In the step 226, the process 200 erases the selected blocks, increments the P/E cycle count, and returns to the step 208 to begin another iteration.

In an example where each block has m pages, and each page contains n codewords, the total number of codewords inside a flash block will be mxn. If j blocks are selected, the total number of codewords that are written each time is mxnxj. For each codeword, when a first uncorrectable ECC happens, the failed uncorrectable (raw) data is dumped from the buffer and compared with the original data to count the number of errors that caused the LDPC first time failure. In the meantime, the uncorrectable ECC failure count associated with this number of raw error count is incremented by 1. After N P/E cycles, the number of codewords having a first uncorrectable ECC failure at certain numbers of raw error count is known. A histogram (probability) distribution of the probability that the LDPC code will have a first uncorrectable ECC failure at a certain number of raw bit error count can then be generated.

Figure 6:
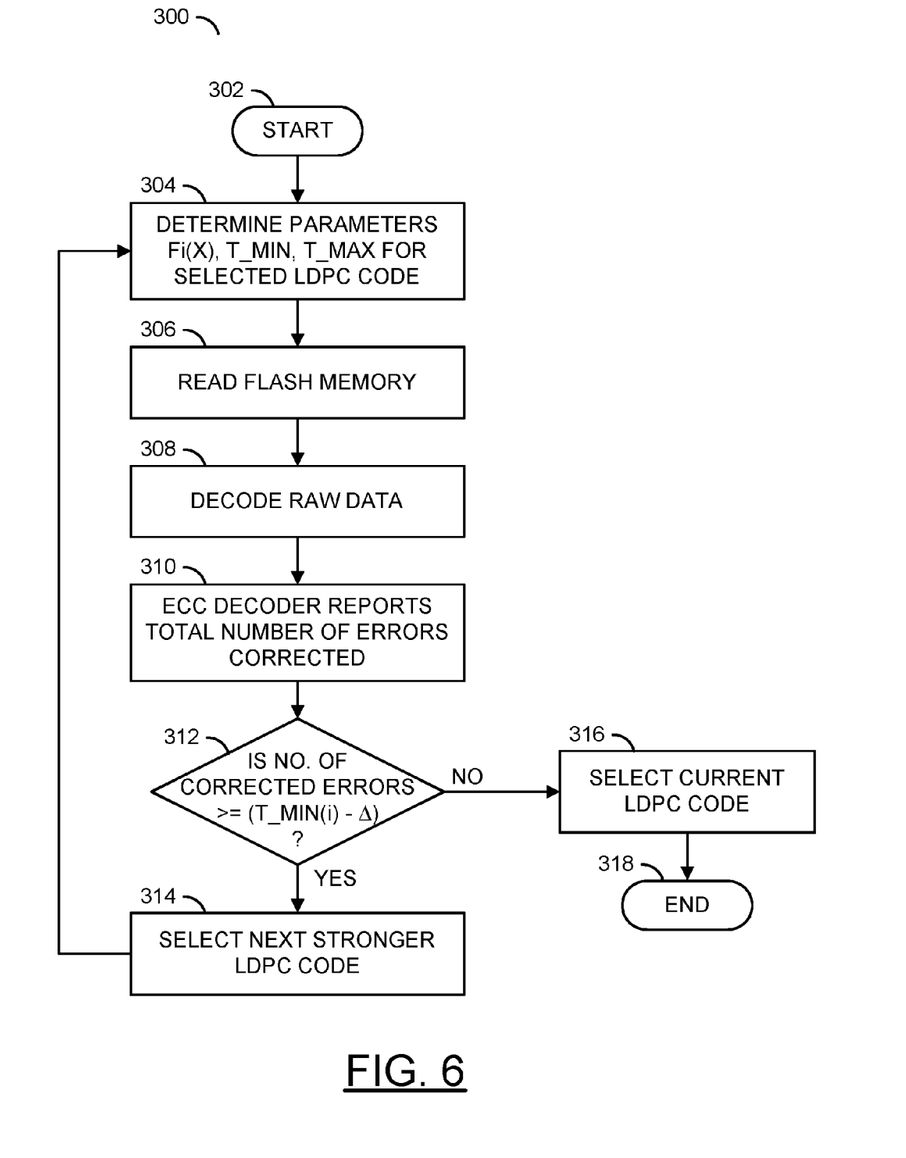
FIG. 6 is a flow diagram illustrating an example selection process in accordance with an embodiment of the invention.

Referring to FIG. 6, a flow diagram of a process 300 illustrating an example selection method in accordance with an embodiment of the invention is shown. The process (or method) 300 provides a conservative solution. In the following descriptions a current selected LDPC code is represented by LDPC-i, the minimum number of errors that cause a first UECC is represented by T_min(i), the maximum number of errors that cause a first UECC is represented by T_max(i), and the distribution function determined during offline characterization of the LDPC-i code is represented by Fi(x). In various embodiments, the process (or method) 300 comprises a number of steps (or states) 302-318. The process 300 begins in the step 302 and moves to a step 304. In the step 304, the process 300 performs a flash memory read and stores the raw data in a buffer. In a step 306, the process 300 performs hard LDPC decoding of the raw data in the buffer. In a step 310, the process 300 determines the total number of errors corrected by the ECC decoder.

In a step 312, the process 300 checks whether the number of errors corrected by the ECC decoder is greater than or equal to the minimum number of errors that cause a first UECC less a predetermined (programmable) margin (e.g., T_min(i)–Δ, where Δ represents a non-negative number (could be zero) selected for the margin) for the selected LDPC code. In various embodiments, the value T_min(i) is read from a lookup table. If the number of errors corrected by the ECC decoder is greater than or equal to T_min(i)–Δ, the process 300 moves to a step 314. If the number of errors corrected by the ECC decoder is less than T_min(i)–Δ, the process 300 moves to a step 316. In the step 314, the process 300 selects the next stronger LDPC code (e.g., LDPC-(i+1)) and returns to the step 304. In the step 316, the process 300 selects the current LDPC code and terminates.

When reading the flash memory, after decoding the raw data, the ECC decoder reports the total number of errors that have been corrected. The first time that the number of errors that have been corrected is equal to or greater than the minimum number of errors that cause first UECC less a predetermined margin (e.g., T_min(i)–Δ), LDPC-i is switched to one of the stronger LDPC codes (e.g., LDPC-(i+1)). The flash controller then checks the corrected error number with the minimum number of errors that cause first UECC less the predetermined margin for the stronger LDPC code (e.g., T_min(i+1)–Δ). If the number of errors is smaller than T_min(i+1)–Δ, LDPC-(i+1) is selected as the new current LDPC code. Otherwise, the next stronger LDPC codes (e.g., LDPC-(i+2), etc.) are selected and compared iteratively. The iteration stops when a proper (e.g., T_min(i+x)–Δ>the number of corrected errors) LDPC code is selected.

Figure 7:
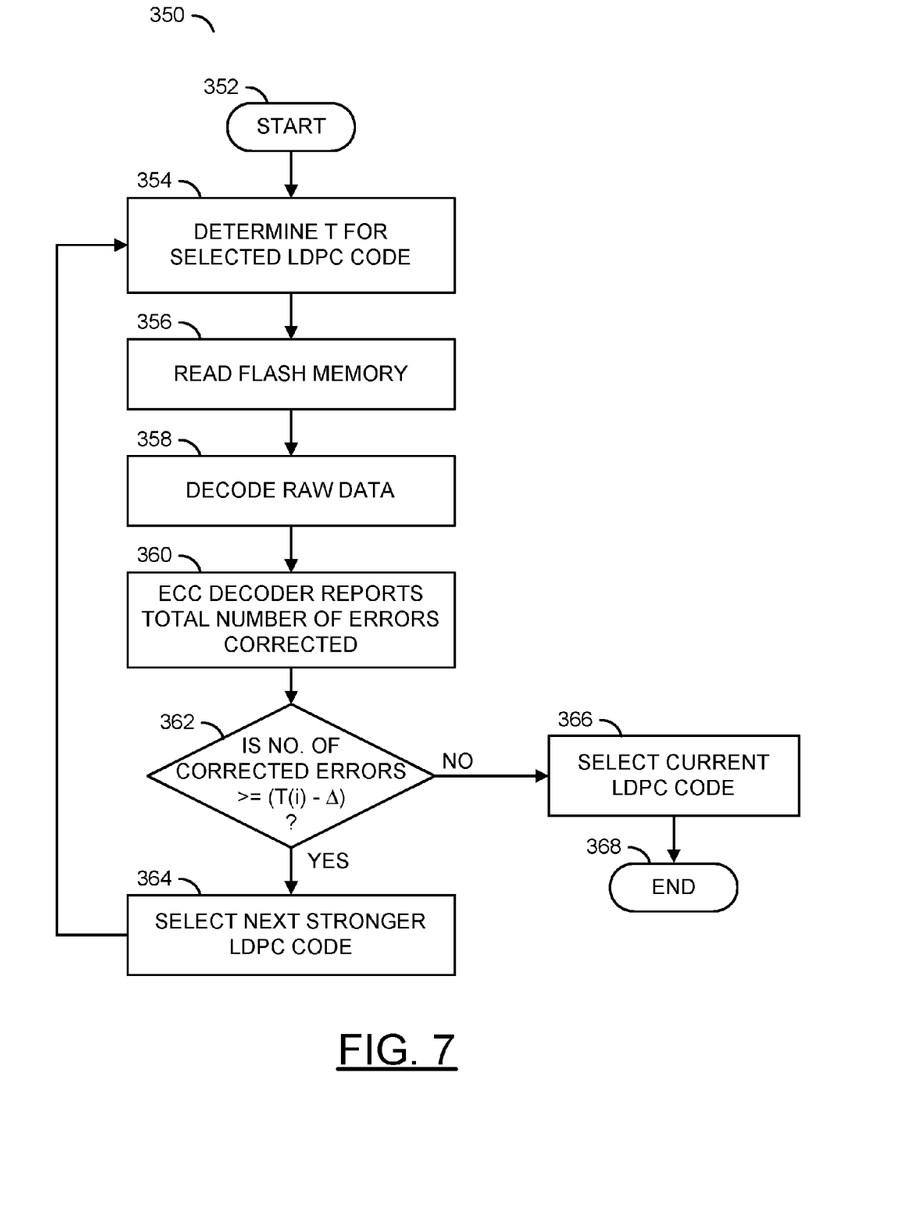
FIG. 7 is a flow diagram illustrating another example selection process in accordance with another embodiment of the invention.

Referring to FIG. 7, a flow diagram of a process 350 illustrating another example selection method in accordance with an embodiment of the invention is shown. In some embodiments, the flash controller may be configured to allow a certain UECC rate of the hard LDPC codes (e.g. R=$10^{-4}$). Since the distribution of LDPC codes can be characterized offline before product delivery, the distribution Fi(x) of a particular code LDPC-i is known. A number T can be determined that satisfies the following Equation 2:

$$\int_{T_{MIN}}^{T} Fi(x)dx = R. \qquad \text{EQ. 2}$$

The number T for each of the LDPC codes is recorded after offline characterization, and used in the product (e.g., associated with the respective LDPC code in a lookup table).

The process (or method) 350 utilizes the values T for each of the LDPC codes. In various embodiments, the process (or method) 350 comprises a number of steps (or states) 352-368. The process 350 begins in the step 352 and moves to a step 354. In the step 354, the process 350 performs a flash memory read and stores the raw data in a buffer. In a step 356, the process 350 performs hard LDPC decoding of the raw data in the buffer. In a step 360, the process 350 determines the total number of errors corrected by the ECC decoder.

In a step 362, the process 350 checks whether the number of errors corrected by the ECC decoder is greater than or equal to the value T for the current LDPC code less a predetermined (programmable) margin (e.g., T(i)–Δ, where Δ represents a non-negative number (could be zero) selected for the margin). In various embodiments, the value T(i) is read from a lookup table. If the number of errors corrected by the ECC decoder is greater than or equal to T(i)–Δ, the process 350 moves to a step 364. If the number of errors corrected by the ECC decoder is less than T(i)–Δ, the process 350 moves to a step 366. In the step 364, the process 350 selects the next stronger LDPC code (e.g., LDPC-(i+1)) and returns to the step 354. In the step 366, the process 350 selects the current LDPC code and terminates.

When reading the flash memory, after decoding the data, the ECC decoder reports the total number of errors that have been corrected. The first time that the number of errors that is corrected is equal to or greater than T(i)–Δ, where Δ represents a non-negative number (could be zero) selected for a margin, the code LDPC-i is switched to a stronger one of the LDPC codes using an iterative process. The flash controller switches to code LDPC-(i+1) and continues to check the current corrected error number with T(i+1)–Δ. If the current corrected error number is smaller than T(i+1)–Δ, LDPC-(i+1) is selected. Otherwise, the next stronger LDPC codes (e.g., LDPC-(i+2), etc.) are selected, and iteration stops when a LDPC code is selected with T(i+j))–Δ greater than the current corrected error number.

In general, switching from weaker LDPC codes to stronger LDPC codes based on the event that UECC has happened may have problems. Either the switch will be done too early, with unnecessary system cost, or the switch will be done too late, causing performance degradation by triggering soft-LDPC too often or simply causing unrecoverable failure for hard-LDPC only products (one possible product with cost saving). In various embodiments, a solution is provided that is based on the number of errors that is corrected by leveraging the information pre-characterized offline to avoid the above problems. A flash controller implemented in accordance with an embodiment of the invention can predict accurately that either UECC will not happen or UECC will only happen at a rate less than acceptable, without really seeing UECC happen.

In some embodiments, a flash controller implemented in accordance with an embodiment of the invention can either avoid UECC before strongest LDPC code is selected, or accurately control the first time UECC failure rate. The solution provided by embodiments of the present invention is low cost: small lookup table to record T_min and T(R), where T(R) is the number of errors that will cause the probability of first time UECC failure rate to be equal to R, and R is defined by product specification (e.g., $10^{-4}$).

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

The functions illustrated by the diagrams of FIGS. 1 and 5-6 may be implemented using one or more of a conventional general purpose processor, digital computer, microprocessor, micro controller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multichip modules. Those skilled in the relevant art(s) would understand that the elements of the invention may be implemented in other types of devices to meet the criteria of a particular application.

While the invention has been particularly shown and described with reference to embodiments thereof, it will be understood by those skilled in the art that various changes in form and details may be made without departing from the scope of the invention.

The invention claimed is:

1. A method of generating a lookup table characterizing distribution properties of a maximum number of errors that first cause uncorrectable error correction code failure for improving performance of a storage controller related to switching between a plurality of hard-decision low density parity check codes available in the storage controller, the method comprising the steps of:
    selecting a low density parity check code from the plurality of hard-decision low density parity check codes;
    generating encoded data with the selected low density parity check code and writing the encoded data to a number of memory blocks;
    reading the encoded data from the number of memory blocks and determining any pages having a first uncorrectable error correction code failure;
    determining a number of raw bit errors for each page having a first uncorrectable error correction code failure;
    incrementing an error count value corresponding to each of the numbers of raw bit errors determined;
    repeating the generating, reading, determining, and incrementing steps for a predetermined range of values of at least one predetermined reliability statistic of the memory blocks; and
    storing predetermined data characterizing the distribution properties of the maximum number of errors that first cause uncorrectable error correction code failure for the selected low density parity check code in the lookup table, wherein the storage controller tracks the at least one predetermined reliability statistic of the memory blocks and comprises an error correction code selector that controls when the storage controller switches from a current one of the plurality of hard-decision low density parity check codes to a stronger one of the plurality of hard-decision low density parity check codes based on the lookup table and the at least one predetermined reliability statistic of the memory blocks.

2. The method according to claim 1, wherein the at least one predetermined reliability statistic comprises a program and erase (P/E) cycle count.

3. The method according to claim 1, further comprising:
    repeating the selecting, generating, reading, determining, incrementing, and storing steps for each of the plurality of hard decision low density parity check codes.

4. The method according to claim 3, further comprising:
    determining the predetermined data embodied in the lookup table characterizing the distribution properties of each of the plurality of hard-decision low density parity check codes.

5. The method according to claim 4, wherein the predetermined data embodied in the lookup table characterizing the distribution properties of each of the plurality of hard-decision low density parity check codes is determined using histograms correlating a number of pages having a first uncorrectable error correction code failure with a number of errors corrected that caused the first uncorrectable error correction code failures.

6. The method according to claim 4, further comprising:
    storing the predetermined data in the lookup table characterizing distribution properties of each of the plurality of hard-decision low density parity check codes in a lookup memory of the storage controller.

7. The method according to claim 6, wherein the lookup memory and storage controller are part of a solid state drive.

8. An apparatus comprising:
    a memory configured to store data; and
    a controller configured to track at least one predetermined reliability statistic related to a condition of the memory and determine an error threshold, which are utilized by the controller to determine when to switch from a current one of a plurality of hard-decision low density parity check codes to a stronger one of the plurality of hard-decision low density parity check codes based on the at least one predetermined reliability statistic related to the condition of the memory and a lookup table embodying predetermined data characterizing distribution properties of a maximum number of errors that first cause uncorrectable error correction code failure for the hard-decision low density parity check codes available in the controller, wherein the lookup table is generated by
        selecting a hard-decision low density parity check code from the plurality of hard-decision low density parity check codes available in the controller,
        generating encoded data with the selected hard-decision low density parity check code and write the encoded data to a number of blocks of the memory,
        reading the encoded data from the number of memory blocks and determining any pages having a first uncorrectable error correction code failure, determining a number of raw bit errors for each page having a first uncorrectable error correction code failure, incrementing an error count value corresponding to each of the numbers of raw bit errors determined, repeating the generating, reading, determining, and incrementing steps for a predetermined range of values of the at least one predetermined reliability statistic related to the condition of the memory, and generating entries in the lookup table characterizing distribution properties of the maximum number of errors that first cause uncorrectable error correction code failure of the selected hard-decision low density parity check code.

9. The apparatus according to claim 8, wherein the predetermined reliability statistic comprises a program and erase (P/E) cycle count.

10. The apparatus according to claim 8, wherein the controller is further configured to repeat the selecting, generating, reading, determining, and incrementing steps for each of the plurality of hard-decision low density parity check codes.

11. The apparatus according to claim 10, wherein the controller is further configured to determine the predetermined data embodied in the lookup table characterizing the distribution properties of each of the plurality of hard-decision low density parity check codes.

12. The apparatus according to claim 11, wherein the predetermined data embodied in the lookup table characterizing the distribution properties of each of the plurality of hard-decision low density parity check codes is determined using histograms correlating a number of pages having a first uncorrectable error correction code failure with a number of errors corrected that caused the first uncorrectable error correction code failures.

13. The apparatus according to claim 11, further comprising a lookup memory configured to store the lookup table embodying the predetermined data characterizing the distribution properties of each of the plurality of hard-decision low density parity check codes.

14. The apparatus according to claim 13, wherein the memory, the controller, and the lookup memory are part of a solid state drive.

15. The apparatus according to claim 11, wherein the controller is further configured to program the predetermined data characterizing the distribution properties of each of the plurality of hard-decision low density parity check codes into a lookup memory of one or more solid state drives.

16. A method of generating a lookup table characterizing distribution properties of a number of errors that first cause uncorrectable error correction code failure for improving switching decisions between a plurality of hard-decision low density parity check codes made by a controller of a solid state drive, the method comprising the steps of:

selecting a hard-decision low density parity check code from the plurality of hard-decision low density parity check codes;

generating encoded data with the low density parity check code and writing the encoded data to a number of memory blocks;

reading the encoded data from the number of memory blocks and determining any pages having a first uncorrectable error correction code failure;

determining a number of raw bit errors for each page having a first uncorrectable error correction code failure;

incrementing an uncorrectable error correction code failure count value associated with each of the numbers of raw bit errors determined;

repeating the generating, reading, determining, and incrementing steps for a predetermined range of values of at least one predetermined reliability statistic of the memory blocks; and generating one or more entries in the lookup table using a error correction code failure histogram correlating a number of pages having a first uncorrectable error correction code failure with a number of errors corrected that caused the first uncorrectable error correction code failures for the selected hard-decision low density parity check code, wherein the controller tracks the at least one predetermined reliability statistic of the memory blocks and determines an error threshold, which is utilized by the controller to determine when the controller switches from a current one of the plurality of hard-decision low density parity check codes to a stronger one of the plurality of hard-decision low density parity check codes based on the lookup table and the at least one predetermined reliability statistic of the memory blocks.

17. The method according to claim 16, wherein the at least one predetermined reliability statistic comprises one or more of a count of a number of program and erase (P/E) cycles, charge loss over time, program interference from programming neighboring cells, program interference from reading neighboring cells, non-erase state read voltage distributions, and erase state read voltage distributions.

18. The method according to claim 16, further comprising:

repeating the selecting, generating, reading, determining, incrementing, and histogram generating steps for each of the plurality of hard-decision low density parity check codes.

19. The method according to claim 18, further comprising:

determining the predetermined data embodied in the lookup table characterizing the distribution properties of each of the plurality of hard-decision low density parity check codes using the error correction code failure histogram for each of the plurality of hard-decision low density parity check codes.

20. The method according to claim 18, wherein:

the predetermined data characterizing the distribution properties of each of the plurality of hard-decision low density parity check codes comprises a lower bound of the distribution and a number of errors that will cause the probability of first time UECC failure rate to be equal to a predefined value.

* * * * *